United States Patent [19]

Bright

[11] Patent Number: 4,881,028

[45] Date of Patent: Nov. 14, 1989

[54] FAULT DETECTOR

[76] Inventor: James A. Bright, 5721 S. Hanover Way, Englewood, Colo. 80111

[21] Appl. No.: 205,952

[22] Filed: Jun. 13, 1988

[51] Int. Cl.⁴ .................. G01R 1/20; G01R 19/14
[52] U.S. Cl. ............................ 324/127; 324/96; 324/133; 324/555; 340/664
[58] Field of Search .............. 324/96, 127, 133, 501, 324/543, 522, 555; 340/664

[56] References Cited

U.S. PATENT DOCUMENTS

| | | | |
|---|---|---|---|
| 2,038,277 | 4/1936 | Gent | 324/96 |
| 2,081,839 | 5/1937 | Rankin | 324/96 |
| 3,249,759 | 5/1966 | Sendro | 324/96 |
| 3,290,593 | 12/1966 | Crowdes | 324/96 |
| 3,461,384 | 12/1969 | Bayati et al. | 324/96 |
| 4,438,396 | 3/1984 | Harnden, Jr. et al. | 324/96 |

Primary Examiner—Ernest F. Karlsen
Attorney, Agent, or Firm—Hill, Van Santen, Steadman & Simpson

[57] ABSTRACT

A new type of immersible fault detector which includes a magnetic coupling link that can be coupled to a power line and a detector receives energy proportional to the load currents flowing in the power line and energizes a light source. A fiber-optics light waveguide or cable is connected to the detector so as to detect the light generated by the detector and has its opposite connected to an indicator which is remote from the detector and is electrically insulated therefrom so that the condition of the power line can be determined.

3 Claims, 1 Drawing Sheet

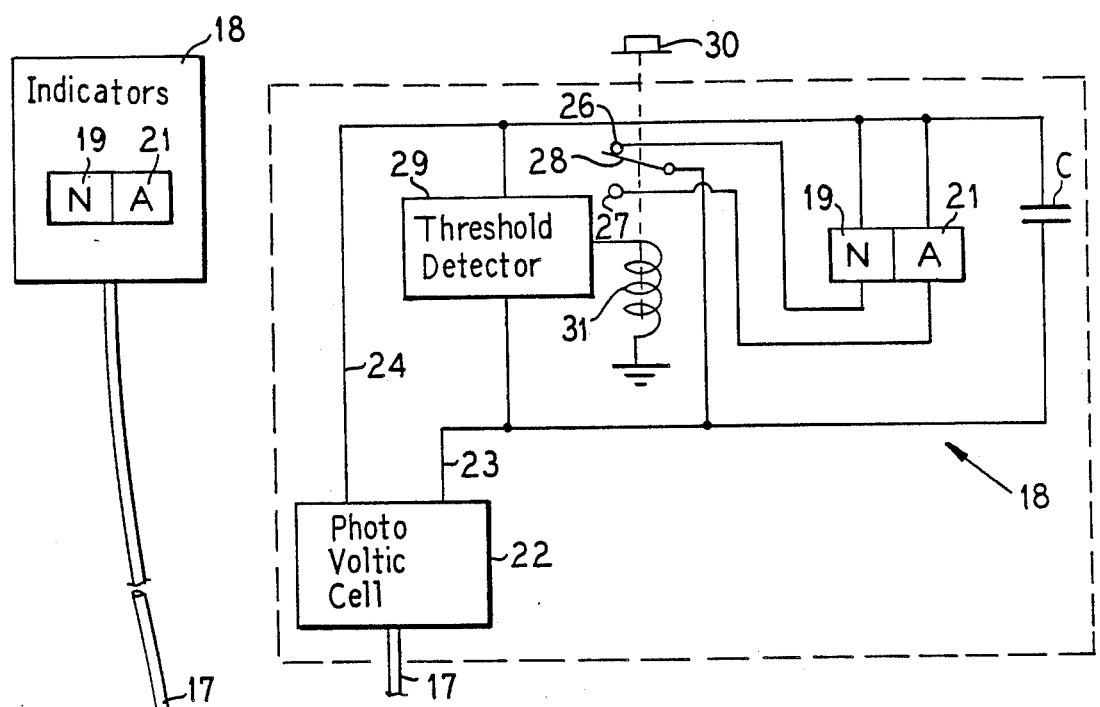

FAULT DETECTOR

BACKGROUND OF THE INVENTION

1. Field of the Invention

This invention relates in general to fault detectors and particularly to a novel electrically insulated indicator which is connected to a fault detector that monitors current in a power line.

2. Description of the Prior Art

Prior art fault indicators which are connected to overhead distribution lines have normally included an indicator that switches to a different color to indicate that the preset current limit has been exceeded. After the short has been repaired, and normal service has been restored, the indicator may be manually reset using a non-conductive pole or "hot stick". Some fault indicators include means for automatically resetting whenever normal load current has existed for a predetermined time period.

The advent of underground distribution systems requires that fault detectors be placed around the conductors at the bottom of access vaults. Also, the indicator device must be near the top of the vault so that it is not covered by water seepage. It is preferable that the indicator could be viewed without even opening the vault so as to speed up the searching process. The fault detector device along with the cable connected to the indicating device must be water-tight so as to provide for immersion for underground applications. Some electric utilities would not use immersible fault detectors because of the electrical hazard to repair crews. Distribution feeders operate at 12,000 v or even higher and represent a hazard if the insulation should fail and cause the high voltage to be connected to the indicator through the cable attached to the fault detector.

Fault indicators are devices used to indicate that the current and electrical power line has exceeded a preset limit after the time that the indicating mechanism was last reset.

Fault indicators may be installed on various branches of an electrical distribution system so as to provide information for repair crews who must find and repair the shorted element. Without fault indicators, the repair crew must operate on a trial and error method of disconnecting individual branch circuits and closing the network circuit breaker so as to determine if the isolated branch was the one in which a fault occurred.

Fault indicators connected to overload distribution lines include an indicator that switches to a different color to indicate that the preset current limit was exceeded. Once the short has been repaired and normal service has been restored, the indicator may be reset manually.

SUMMARY OF THE INVENTION

It is an object of the present invention to provide a fault detector which includes an immersible fault detector that is coupled to a power line so as to energize a light source and further includes a remote indicator which is connected to the fault detector with a fibre-optics cable which picks up the light energy from the light source and supplies it to a photo-voltic cell that generates a signal indicative of the current in the power line. The photo-voltic cell drives an indicator which indicates normal or alarm when the current has exceeded the preset limit.

It is an object of the present invention to provide an immersible fault detector which has an indicator which is electrically insulated from the fault detector and which can be located at a remote point so as to prevent electrical injury to work crews who monitor the indicator.

Other objects, features and advantages of the invention will be apparent from the following description of certain preferred embodiments thereof taken in conjunction with the accompanying drawings although variations and modifications may be effected without departing from the spirit and scope of the novel concepts of the disclosure, and in which:

BRIEF DESCRIPTION OF THE DRAWINGS

FIG. 1 illustrates the fault detector and indicator of the invention;

FIG. 2 is an electrical schematic view of the indicator portion of the fault detector; and FIG. 3 illustrates a modification of the invention.

DESCRIPTION OF THE PREFERRED EMBODIMENTS

The current flowing in a power line 10 is monitored by a magnetic coupling link 11 which detects a signal proportional to current in the power line 10 and supplies it to the immersible unit 12 which includes a light source as, for example, a light bulb 16 which is connected by leads 13 and 14 to the magnetic coupling link 11. The intensity of the light produced by the light bulb 16 is proportional to the current flowing in the power line 10. The fiber optic cable 17 has a first end connected to the detector 12 such that the light energy emitted by the light bulb 16 passes into the fiber optic cable 17 where it is transmitted to a remote indicator 18 which has indicators 19 and 21 which respectively indicate the normal and alarm conditions. The detector 12 may be mounted inside a vault through which the power line 10 passes and the indicator 18 may be external of the vault so the indicators 19 and 21 are visible without opening the vault. The fiber-optic cable 17 comprises an electrical insulator and, thus, the indicator 18 is not electrically connected to the power line 10 even under conditions where the vault is partially filled with water and, thus, personnel monitoring the indicator 18 need not come in contact with the water inside the vault which may be shorted to the power line 10.

FIG. 2 is an electrical schematic of the indicator portion 18 and the second end of the fiber-optic cable 17 is mounted to a photo-voltic cell 22 which receives the light energy through the cable 17 from the light bulb 16 and generates an output voltage proportional to the intensity of the received light energy. The voltage generated by the photo-voltic cell 22 is supplied to output lines 23 and 24. The lead 23 is connected to the moveable contact 28 of a two position switch that is moveable between fixed contacts 26 and 27. Fixed contact 26 is connected to one side of the normal indicator 19 which may be a light bulb mounted behind a transparent "N", for example. The other side of the indicator 19 is connected to lead 24. An alarm indicator 21 includes a light bulb mounted behind a transparent A and has one side connected to the conductor 24 and the other side connected to fixed contact 27 of the switch. A capacitor C is connected across leads 23 and 24. A threshold detector 29 is connected across leads 23 and 24 and provides an output to a relay 31 which is mechanically coupled to the moveable contact 28 of the switch. The switch contact 28 is engaged with the fixed contact 26 as long as the current in the power line 10 is below a predetermined limit. When the current in the power line 10 exceeds the predetermined limit, the light bulb 16 in the detector 12 will produce a light intensity which passes through the fiber optics cable 17 to energize the photo-voltic cell 22 with a voltage which has a level sufficient to cause the threshold detector 29 to energize the relay 31 thus moving the contact 28 to engagement with the fixed contact 27 and out of engagement with the fixed contact 26. The relay 31 may be a latching relay so that when the current in the power line 10 exceeds the predetermined level the relay will remain locked holding the switch contact 28 in engagement with the fixed contact 27 until the relay as reset by a reset button 30 by an operator.

Thus, the fault detector and indicator monitors the current in power line 10 and if the current in power line 10 exceeds a preset limit, the indicator 18 will switch from a normal indication indicated by the indicator 19 to an alarm indication indicated by the alarm indication 21. Even if the power line 10 is de-energized, the display 21 will continue to provide an indication by using energy stored in the capacitor C which stores energy from the photo-voltic cell 22.

The power line 10 would be de-energized by circuit breakers in the power system shortly after the over-current condition occurred. However, the indicator 21 would continue to indicate an Alarm condition by utilizing the energy stored in the capacitor. The alarm state would remain until normal load current is again detected at which time the display 21 would be turned off and the display 19 would be energized. Such operation could occur if the relay 31 had a latch release when the threshold detector 29 again detects normal current in the power line 10.

FIG. 3 illustrates a modification of the invention wherein the capacitor C of FIG. 2 is replaced by the battery E so that the battery energizes the indicator 21 after current in power line 10 has been de-energized.

If the power line remains de-energized for an extended period of time, the energy stored in the capacitor or battery would be depleted and the display 21 would change to a dead state or be blank.

It is seen that this invention provides a novel submersible fault detector and although it has been described with respect to preferred embodiments, it is not to be so limited as changes and modifications may be made therein which are within the full intended scope as defined by the appended claims.

I claim as my invention:

1. A fault detector and indicator for monitoring the current in a power line which may be immersed in water comprising, a detector mounted adjacent the power line, magnetic coupling means coupled to said power line and supplying an output to said detector, a light generator in said detector receiving the output of said magnetic coupling means and producing light emission in response thereto, a fiber optics cable with one end attached to said detector such that it receives light energy emitted by said light generator, and an indicator located remotely from said detector connected to a second end of said fiber optics cable and producing an indication from the received light energy indicative of the current in said power line, wherein said indicator includes a photo-voltic cell which is mounted so as to receive light energy from said second end of said fiber optic cable and indicating means connected to said photo-voltic cell, wherein said indicating means includes first and second display means for, respectively, displaying indications of "normal" or "alarm" conditions for the current monitored in said power line, including a threshold detector connected to the output of said photo-voltic cell, a two-way switch with a moveable switch contact connected to one output lead of said photo-voltic cell and with two fixed contacts, respectively, connected to said first and second display means, a second output lead of said photo-voltic cell connected to said first and second display means, and a relay connected to receive the output of said threshold detector and connected to the moveable contact of said two-way switch.

2. A fault detector and indicator according to claim 1 including a capacitor connected across said first and second output leads of said photo-voltaic cell.

3. A fault detector and indicator according to claim 1 including a battery connected across said first and second output leads of said photo-voltic cell.

* * * * *